(12) United States Patent
Parameswaran et al.

(10) Patent No.: US 7,535,772 B1
(45) Date of Patent: May 19, 2009

(54) CONFIGURABLE DATA PATH ARCHITECTURE AND CLOCKING SCHEME

(75) Inventors: Suresh Parameswaran, Milpitas, CA (US); Thinh Tran, Palo Alto, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 917 days.

(21) Appl. No.: 10/877,932

(22) Filed: Jun. 25, 2004

Related U.S. Application Data

(60) Provisional application No. 60/483,419, filed on Jun. 27, 2003.

(51) Int. Cl.
*G11C 7/00* (2006.01)
(52) U.S. Cl. .......................... 365/189.02; 365/233.13; 365/233.18; 365/233.19; 365/239; 365/189.05; 365/189.12; 365/230.02
(58) Field of Classification Search ............ 365/189.02, 365/233.13, 233.18, 233.19, 239, 189.05, 365/189.12, 230.02
See application file for complete search history.

(56) References Cited

U.S. PATENT DOCUMENTS

| | | | |
|---|---|---|---|
| 6,069,839 A | 5/2000 | Pancholy et al. | |
| 6,262,936 B1 | 7/2001 | Arcoleo et al. | |
| 6,262,937 B1 | 7/2001 | Arcoleo et al. | |
| 6,275,441 B1 | 8/2001 | Oh | |
| 6,385,128 B1 | 5/2002 | Arcoleo et al. | |
| 6,876,558 B1 * | 4/2005 | James et al. ................ | 365/49.1 |
| 6,934,199 B2 * | 8/2005 | Johnson et al. ............. | 365/194 |
| 7,085,905 B2 * | 8/2006 | Chao .......................... | 711/167 |

* cited by examiner

*Primary Examiner*—Huan Hoang
*Assistant Examiner*—Fernando N Hidalgo

(57) ABSTRACT

Data paths (100 and 900) can be configured to accommodate two or four burst data sequences, with a data value being input/output each half clock cycle. A data sequence can be a fixed order or user-defined order depending upon a selected option. A data input path (100) can reduce power consumption with an enable signal (dinen) timed to activate after data input lines have settled values. A data output path (900) can access output data in a parallel fashion for subsequent output according to a burst sequence. Cycle latencies for such output data can include one clock cycle latency or one and a half-clock cycles. A data output path (900) can also accommodate various clocking modes, including: single clocking with a delay locked loop (DLL) type circuit enabled, single clocking with a delay locked loop (DLL) type circuit disabled, and double clocking, with a phase difference between an input clock and output clock of up to 180°.

7 Claims, 11 Drawing Sheets

CONFIGURABLE DATA PATH ARCHITECTURE AND CLOCKING SCHEME

This application claims the benefit of U.S. Provisional Patent Application Ser. No. 60/483,419 filed on Jun. 27, 2003.

TECHNICAL FIELD

The present invention relates generally to integrated circuits, and more particularly to configurable data paths for integrated circuits.

BACKGROUND OF THE INVENTION

For semiconductor integrated circuits (chips) such as memory devices, it can be cost effective to include multiple product configurations in one base design. For example, it would be desirable for a device to be capable of accommodating multiple input and/or output data configurations.

While memory devices typically perform a like function—storing data values for subsequent access, various data input/output configurations have been proposed. As a first example, the rate at which data is accessed with a respect to a clock signal has given rise to single data rate type designs, in which data is accessed once per clock cycle, as well as double data rate (DDR) type designs.

Further, while some memory can be configured to operate according to a single clocking, others may operate according to double clocking. More particularly, some types of Quad Data Rate™ or QDR™ SRAMs (such as those manufactured by Cypress Semiconductor Corporation, of San Jose, Calif.) may be configurable for both single clocking and double clocking. In a single clocking configuration, input data are clocked into the device and out of the device according to a single clock. In a double clocking configuration, data can be clocked into the device according to one clock, and clocked out of the device according to a second, different clock.

As another example, to increase data throughput, data may be accessed in bursts (a sequential set of data values). However, burst length criteria may vary. That is, a burst length may be variable and/or data ordering for a given burst length can vary. As but two very particular cases, burst lengths may be two or four, while burst ordering may be linear, "interleaved", or some other user designated order.

Conventionally, an integrated circuit may be manufactured to accommodate a given input and/or output configuration by a permanent manufacturing option. Bond and/or metal options may be used to generate appropriate control signals for accommodating a given burst length and/or data ordering. As is well understood, a bond option may be an option in the way input signals are applied to an integrated circuit die (typically by way of bond pad). A metal option can be an option in an integrated circuit metallization layer.

However, conventionally, it can be difficult to design a simple and flexible scheme that can meet a wide variety of device options.

To better understand various aspects of the disclosed embodiments of the invention, a conventional data input path and output path will now be described.

A conventional approach to a data input path (DIN PATH) is shown in FIG. 15, and designated by the general reference character 1500. A conventional data input path 1500 can include eight registers (M/S REG), including a lower four registers 1502-0 to 1502-3 and upper four registers 1502-4 to 1502-7. Input data (DIN) can be serially shifted through the lower four registers (1502-4 to 1502-7) according to input clock edges (k/kb). Next, data in lower registers (1502-0 to 1502-3) can be loaded in parallel into upper registers (1502-4 to 1502-7) according to an enable signal en. Upper registers (1502-4 to 1502-7) can be "late-write" registers, for subsequent writing of input data into a memory core.

A conventional approach to a data output path (DOUT PATH) is shown in FIG. 16 and designated by the general reference character 1600. A conventional data output path 1600 can include a four-stage shift register 1602 and an output latch 1604. Shift register 1602 can include registers 1606-0 to 1606-3 connected in series by load/shift multiplexers (MUXs) 1608-1 to 1608-3. Data output path 1600 can also include data MUXs 1610-0 to 1610-3. Each data MUX (1610-0 to 1610-3) can receive core data or match data. Core data (core_data) can be data received from a core portion of a memory device. Match data (match_data) can be data present in an input stage (from a write operation, or the like) that is being read before being written into a core portion. Data MUX 1610-0 can provide data to register 1606-0, while data MUXs 1610-1 to 1610-3 can provide data to load/shift MUXs 1608-1 to 1608-3, respectively.

Data from data MUXs (1610-0 to 1610-3) can be loaded in parallel into registers (1606-0 to 1606-3). Such data may then be serially shifted to output latch 1604 according to clock signals. In FIG. 16, data may be shifted according to clock signals k/kb. Data may be output from output latch 1604 according to output clock signals c/cb. FIG. 16 thus shows a double clocking arrangement.

Both the conventional data input path and the conventional data output path can have drawbacks. In particular, such approaches can lack flexibility in accommodating various data clocking configurations. In particular, both approaches have limits to the order in which data are input to a write path, or output from a read path. Further, such approaches may not be suitable for accommodating multiple functions, such as variations in clocking type (e.g., single or double), or multiple burst lengths, as data values may only be sent in a fixed sequence.

In light of the above, it would be desirable to arrive at a data path arrangement that is relatively simple to implement.

It would also be desirable to arrive at a data path arrangement that can flexibly accommodate multiple functions (e.g., data clocking types, burst lengths, burst sequences). It would also be desirable for such an arrangement to be accomplished via a relatively simple process step, in contrast to having to design entirely new circuits for each such variation.

SUMMARY OF THE INVENTION

The present invention can include data paths that can accommodate various modes and features, including different types of burst sequence and clocking.

According to one embodiment, the present invention can include a configurable data path having a de-multiplexer (de-MUX), a plurality of first latches connected in parallel to the de-MUX, and a plurality of data registers connected in parallel to the first latches. The de-MUX can receive multi-bit data values and selectively provide such values to a plurality of outputs. Each first latch can have an input that receives a multi-bit data value from a corresponding de-MUX output. Each data register can have an input that receives a multi-bit data value from a corresponding first latch output.

In this way data, can be received at a de-MUX input, and then selectively passed down data paths in parallel that include a first latch and data register.

According to one aspect of the embodiments, the de-MUX is configurable for at least two modes of operation. In a first mode of operation the de-MUX provides data paths between its input and different outputs in sequential manner. In a second mode of operation, the de-MUX can provide data paths to at least two of its outputs in parallel.

In this way, data can be output from a de-MUX to multiple data paths. Such arrangement may be advantageous in timing schemes where write data may be input prior to a write address being fully decoded/settled.

According to another aspect of the embodiments, a de-MUX can provide data paths between its input and outputs according to a sequence controlled by a plurality of burst write address values. In addition, a burst address generator can generate burst write address values according to one of a plurality of sequences selectable as a device option.

In this way, data may be input according to a variety of burst sequences.

According to another aspect of the embodiments, data registers can be controlled by a register enable signal activated during at least a write operation.

According to another aspect of the embodiments, a plurality of write buffers can be connected in parallel to the data registers. Each write buffer can have an input that receives a multi-bit value from a corresponding data register.

Such an arrangement can allow for delayed write operation, such as a "double late" write. Such a delayed write operation can accommodate variations in timing that may be required for writing to different parts of an array and/or to redundant sections of a device.

According to another aspect of the embodiments, the write buffers can be controlled by a data input enable signal that is activated after the register enable signal in at least a write operation.

Such a timing arrangement can allow a new burst sequence of data to begin when it is ready to be written.

According to another aspect of the embodiments, a data path can include a first match data path connected between outputs of the first latches and a read data path. A first match data path can provide write data that is in transit through the configurable data path to the read data path. Further, a second match data path can be connected between outputs of the data registers and a read data path. Such a match data path can also provide write data through the configurable data path to the read data path.

In this way, a burst sequence of write data propagating through a data input path can be provided, in parallel, to a read data path in the event of a match condition. A match condition being the reading of from an address that is not yet written to.

The present invention can also include a configurable data path having a plurality of first multiplexers (MUXs), a plurality of latch sets connected in parallel to the first MUXs, and at least one second MUX having inputs coupled to a different latch set. Each first MUX can have at least one input that receives a multi-bit data value from a memory cell array. Each latch set can include at least two latches arranged in series that are connected to an output of a corresponding first MUX. A second MUX can have inputs each coupled to a different latch set.

Such an arrangement can allow data to be accessed in parallel that is received from multiple sources, such as a core region, redundant portions, or an input data path (in the case of match data). Such parallel output data can then be output in a burst sequence.

According to another aspect of the embodiments, a plurality of first latches can be coupled in parallel to first MUXs, each first latch having an input coupled to a memory cell array and an output coupled a corresponding first MUX.

Such an arrangement can retain output data while output lines from a memory cell array are placed in a high impedance state.

According to another aspect of the embodiments, first MUXs can be configurable into at least two modes of operation. First MUXs can commonly output data according to a different timing in each mode of operation.

Such an arrangement can allow a data path to accommodate various timing arrangements. In particular, data may be output with a full cycle latency or a one and a half cycle latency.

According to another aspect of the embodiments, a plurality of first MUXs can be controlled by a first enable signal. In a first mode, a first enable signal can rise in response to a first clock signal and fall in response to a second clock signal. In a second mode, a first enable signal can rise and fall in response to a second clock signal.

Such an arrangement can accommodate multiple modes of operation, including those with an enabled delay locked loop (DLL) and those with a disabled DLL.

According to another aspect of the embodiments, each latch set can include a second latch and third latch arranged in series. Each third latch can be controlled according to a second enable signal. The second enable signal can rise in response to an output clock and fall in response to the first enable signal.

Such an arrangement, can allow data to be output to a second MUX while new data is input to the first MUXs.

According to another aspect of the embodiments, a data path can include a delay lock loop (DLL) type circuit that generates DLL clock signals in response to the first and second clock signals when enabled. A DLL type circuit can be enabled in a first mode and disabled in a second mode.

According to another aspect of the embodiments, a data path can further include output drive circuitry. Such output drive circuitry can include an output latch coupled to the at least one second MUX.

In such an arrangement, an output latch can sequentially store each output data value of a burst sequence.

The present invention may also include a configurable data path for a semiconductor memory device. Such a data path can include a data input path that latches input data according to at least two input clock signals. The configurable data path can also include a data output path having a plurality of second data latches arranged in parallel, and an output multiplexer (MUX). An output MUX can be connected to the data latches, and output data can be received from the data latches in a predetermined order. Such data can be output according to burst address values and an output clock control signal. The output clock control signal can rise in response to input clock signals in a single clock mode, and in response to output clock signals, different from the input clock signals, in a double clock mode.

Such an arrangement can allow data to be output from a semiconductor memory device according to multiple clocking arrangements.

According to another aspect of the embodiments, an output control clock can include periodic pulses. In addition, second data latches can output data in parallel to an output MUX in response to a second enable signal. A second enable signal can be activated in response to a last pulse of a predetermined number of periodic pulses.

Such an arrangement can ensure that a new burst of data is output only after a previous burst has been concluded.

According to another aspect of the embodiments, input clock signals can include a first input clock signal and a second input clock signal. In a single clock mode, a second enable signal can be disabled in response to the second input clock signal. In a double clock mode, a second enable signal can be disabled a predetermined delay after being enabled.

Such an arrangement can accommodate multiple clocking configurations, including single and double clocking.

According to another aspect of the embodiments, in a delayed lock loop (DLL) enable mode, an output clock control signal can be generated in response to phase shifted input clock signals generated by phase shifting input clock signals with DLL type circuit. In addition or alternatively, input clock signals can include a first input clock signal and a second input clock signal. A plurality of first data latches can be connected parallel to second data latches that receive output data in response to first enable signal. A first enable signal can be deactivated in response to the second input clock signal. In a DLL enable mode, a second enable signal can be activated in response to the second input clock signal. In a DLL disable mode, a second enable signal can be enabled in response to a first input clock signal.

Such an arrangement can allow a data path to accommodate a DLL enabled mode and a DLL disabled mode.

According to another aspect of the embodiments, a data path can also include a plurality of first multiplexers coupled in parallel to the first data latches. Such first multiplexers can receive data from a core portion of memory device and from an input data path of the memory device.

DETAILED DESCRIPTION

Various embodiments of the present invention will now be described in detail with reference to a number of drawings. The embodiments include data paths for a semiconductor device that are configurable for differing data orders and timing.

Figure 1:
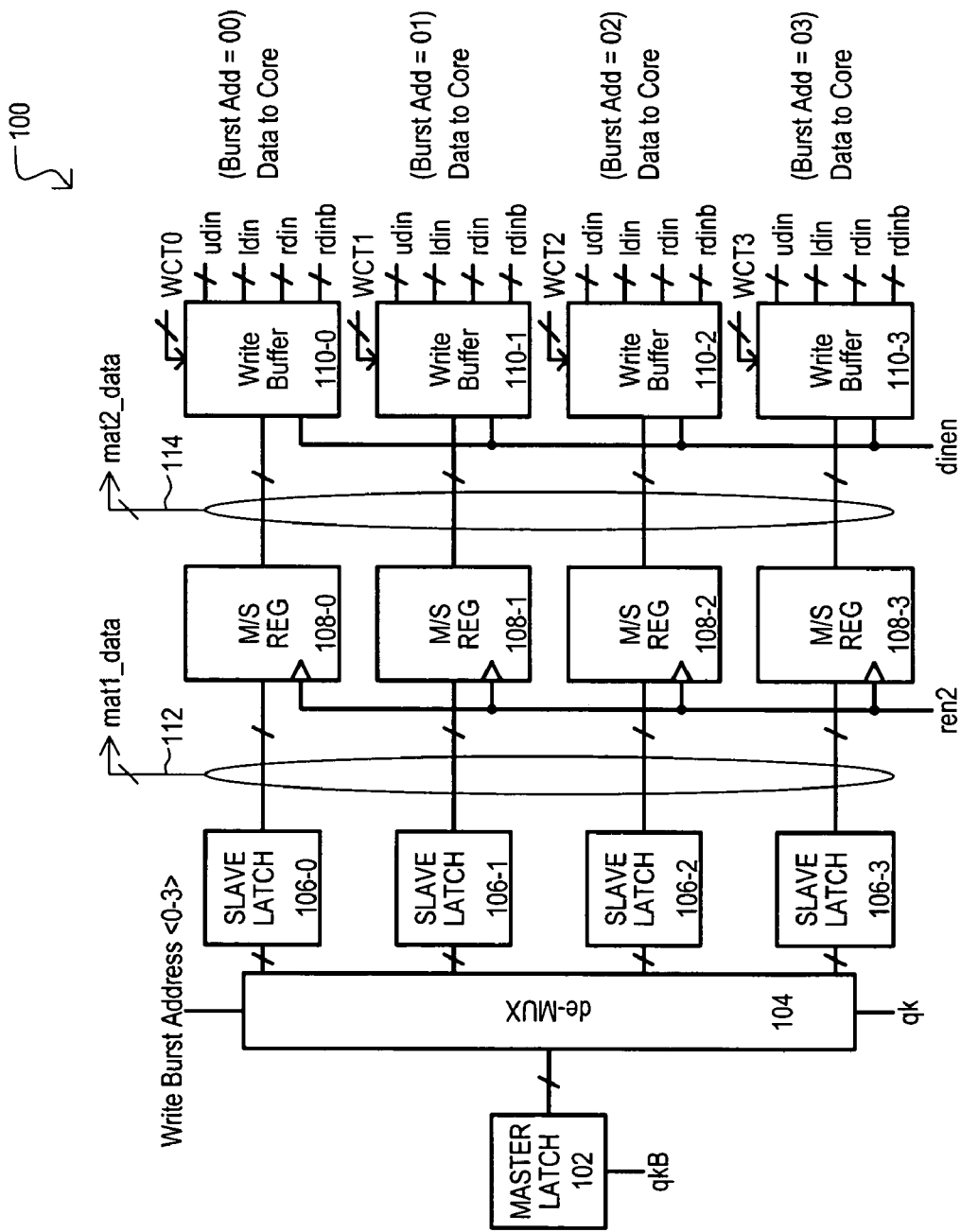
FIG. 1 is a schematic diagram of a data input path according to a first embodiment of the present invention.

A first embodiment of the present invention includes a data input path and is set forth in FIG. 1 and designated by the general reference character 100. A data path 100 can be a data input path that includes a master latch 102, a de-multiplexer (de-MUX) 104, a number of slave latches 106-0 to 106-3, a number of registers 108-0 to 108-3 arranged in parallel with the slave latches (106-0 to 106-3), and a number of write buffers 110-0 to 110-3 arranged in parallel with the registers (108-0 to 108-3).

A master latch 102 can receive bursts of input data. As but one example, a master latch 102 can receive data in bursts of four and/or two data values. Such data values are preferably multi-bit data values (e.g., 4-bit "nibbles", 8-bit bytes, 16-bit words, 32-bit double words, as but a few of the many possible examples). Master latch 102 may output received data values to a de-MUX 104 in response to a clock qkB.

Preferably, a data path 100 can form part of an integrated circuit that operates in response to an externally applied clock signal. In addition, each data value in a burst can be applied at a double data rate (e.g., every ½ clock cycle). Thus, a master latch 102 may operate in response to a clock qkB that operates at twice the frequency of an applied external clock signal (e.g., k).

A de-MUX 104 can have an input for receiving data from a master latch 102. A de-MUX 104 can operate in response to burst address values (Write Burst Address <0-3>) and clock signal qk. Clock signal qk can be a complement clock signal qkb and/or phase shifted therefrom by about 180°.

More particularly, de-MUX 104 can provide a data path from a master latch 102 to a particular slave latch (106-0 to 106-3) according to a burst address values (Write Burst Address <0-3>). In the very particular example of FIG. 1, according to burst address values of 0, 1, 2 and 3, data from master latch 102 can be provided to slave latches 106-0, 106-1, 106-2 and 106-3, respectively, in response to clock signal qk. Thus, sequential data values received by a de-MUX 104 can be output according to a burst sequence provided via burst address values (Write Burst Address <0-3>).

It is noted that a de-MUX 104 can provide advantageous flexibility for accommodating various data input sequence options. In particular, a burst order can be a fixed order or some other order, such as a user defined order. As will be explained in more detail later on, a write burst address value (Write Burst Address <0-3>) may be selectable according to an option. Such an option can dictate the order at which burst address values are generated (Write Burst Address <0-3>), and hence dictate the order at which data values are stored in slave latches (106-0 to 106-3).

Still further, and as will also be explained in more detail below, in some modes of operation, a de-MUX 104 may load a same data value in parallel to multiple slave latches, thus allowing data to be captured before a write address value is decoded (or otherwise settled). Thus, a de-MUX 104 should not be construed as being limited to providing a single data path to slave latches (106-0 to 106-3) in a given half clock cycle.

Slave latches (106-0 to 106-3) can provide output data in parallel to corresponding registers 108-0 to 108-3, respectively. In this way, data received in a burst from a de-MUX 104 can be provided to parallel registers 108-0 to 108-3.

Registers (108-0 to 108-3) can provide output data in parallel to corresponding write buffers 110-0 to 110-3, respectively. Registers (108-0 to 108-3) may commonly output data in parallel to write buffers (110-0 to 110-3) in response to a first enable signal (ren2). In this way, data received from an input burst can be provided in parallel to write buffers 110-0 to 110-3.

Data output from slave latches (106-0 to 106-3) can also be output as first match data (mat1_data) on a first match data path 112. A first match data path 112 can provide data to a data output path (not shown). In this way, first match data (mat1_data) can be provided as read data in the event a read operation occurs at the address of recent write operation. That is, such a data path can allow a read operation to access data in transit through a data input path 100.

Data output from registers (108-0 to 108-3) can also be output as second match data (mat2_data) on second match data path 114. In this way, second match data (mat2_data) further in transit through a data input path 100 can also be accessed in a read operation.

Thus, in a match case (read address matches a recent write address), data may be retrieved and sent directly to an output path for output in a predetermined or user-defined order.

It is understood that burst write operations can enable or disable a match operations.

Write buffers (110-0 to 110-3) can provide data in parallel to given sections of a device according to a second enable signal (dinen). In the particular example of FIG. 1, each write buffer (110-0 to 110-3) can write data to a different "core" portion of a memory device, where each such portion corresponds to a different burst address. Still further, in the example of FIG. 1, each write buffer (110-0 to 110-3) can selectively write data to a different section corresponding to its portion. In FIG. 1, such sections can include an upper section of an array (udin), a lower section of an array (ldin), or redundant sections of an array (rdin and rdinb). As is well understood by those skilled in the art, in the event a device includes defective locations, a device may be reprogrammed to access redundant portions.

Figure 15:
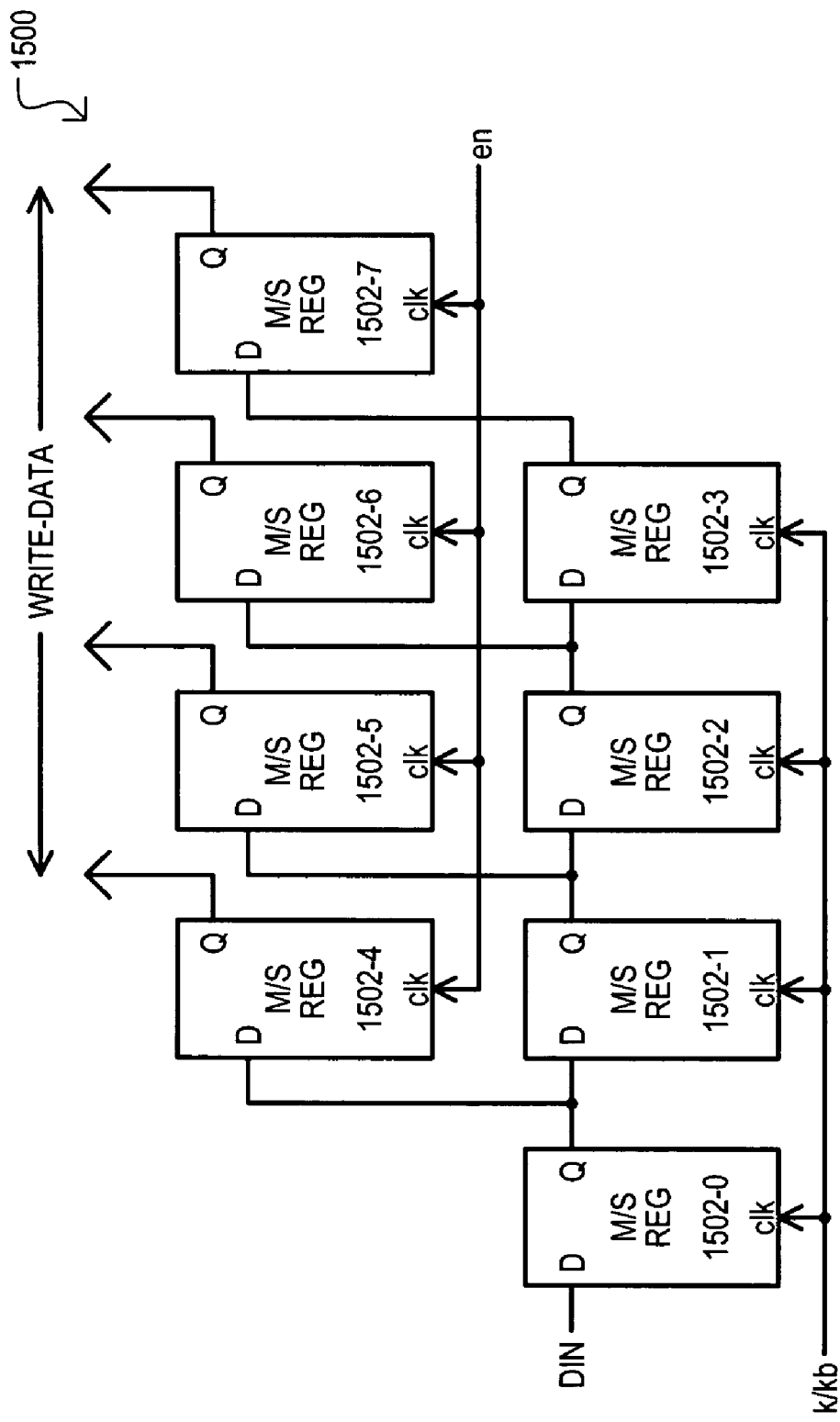
FIG. 15 is a block schematic diagram of a conventional data input path.
Figure 16:
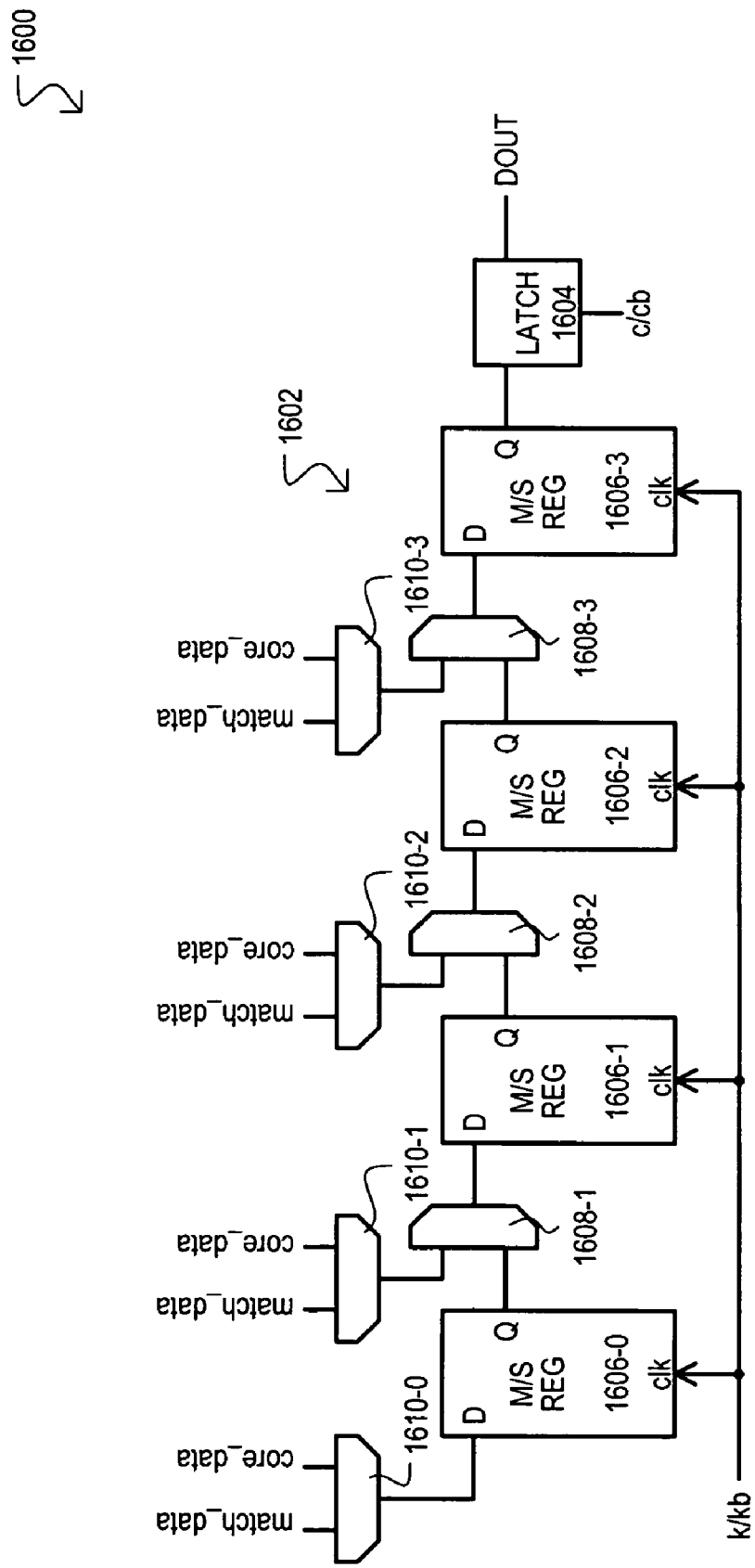
FIG. 16 is a block schematic diagram of a conventional data output path.

Common enabling of write buffers (110-0 to 110-3) according to a same second enable signal (dinen) can result in power savings. In particular, in conventional arrangements, such as that shown in FIG. 15, relative timings between incoming data and a corresponding decoded addresses may not match for all operations. In particular, write multiplexing paths may be different according to address and/or timing for accesses to redundant locations may be different from those to a "regular" (i.e., non-redundant) portion of a core. Such differences can result in false toggling (i.e., glitches) of data lines going to core.

To avoid power waste that can arise from such glitches, according to a first embodiment, data lines going to the core can be commonly gated according to a second enable signal (dinen). Such a second enable signal (dinen) can be timed to accommodate particular access timings. For example, a second enable signal (dinen) may be activated according to a worst-case timing.

In this way, bursts of data may be combined and sent to a core portion of a memory device (e.g., regular and/or redundant columns) for a "late" write operation. A late write operation can be an operation that writes a first set of data after a second set of write data has been received. As will be described in more detail below, in one very particular case, a second enable signal (dinen) can be enabled to result in a "double" late write operation.

Having described the general construction of a data path 100 according to one embodiment, the operation of such an arrangement will now be described with reference to FIG. 2 in conjunction with FIG. 1.

Figure 2:
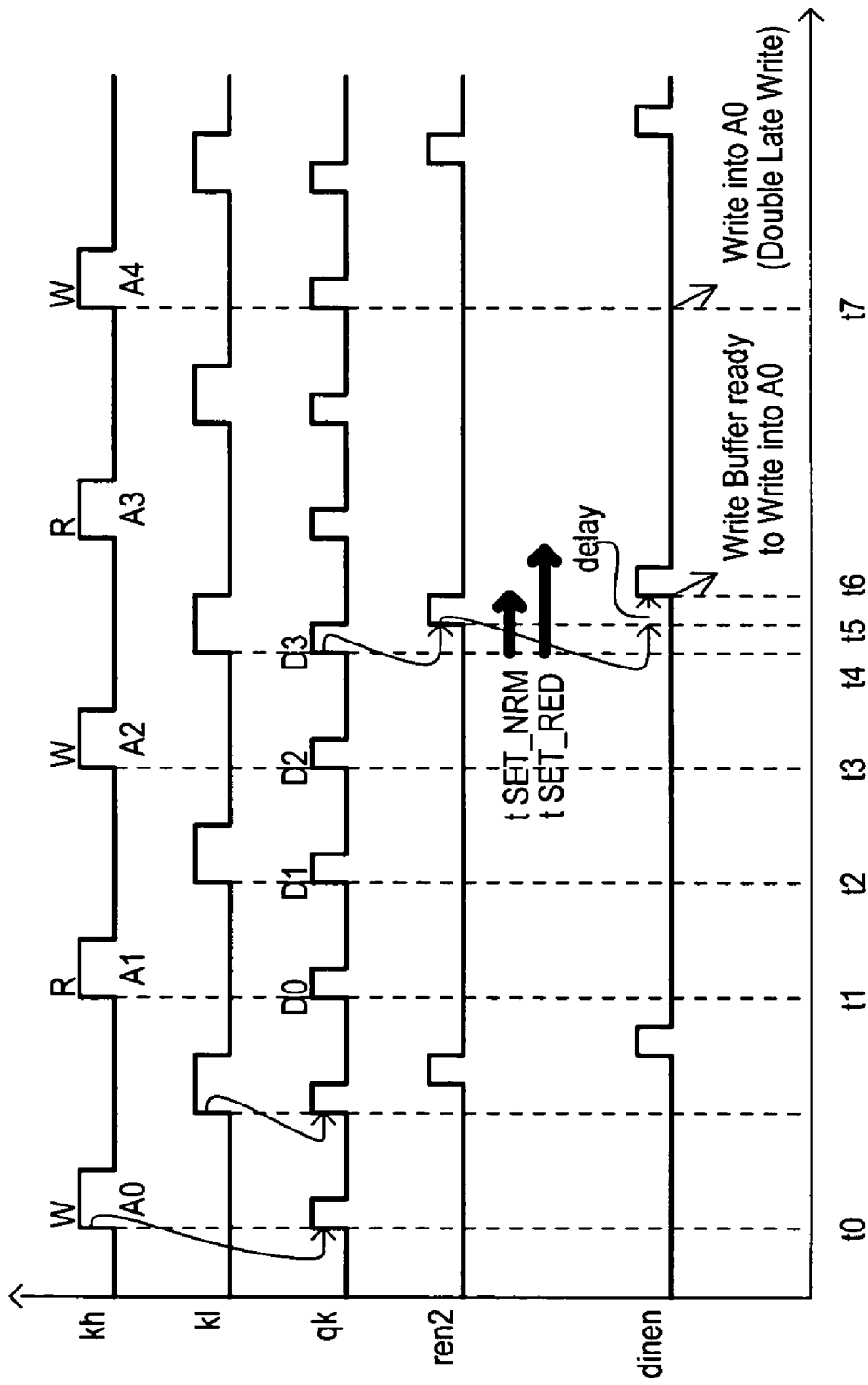
FIG. 2 is a timing diagram showing one mode of operation for the data input path of FIG. 1.

FIG. 2 is a timing diagram showing one mode of operation for the data input path of FIG. 1. FIG. 2 shows a waveform for a first clock kh, a second clock kl, clock qk, first enable signal ren2, and second enable signal dinen. It is understood that second clock kl can be a different clock than clock kh.

Clock qk, connected to de-MUX 104 (with its complement, "qkB" connected to master latch 102) can be free running and triggered by edges of both kh/kl (in this example, rising edges). First enable signal "ren2" can be triggered in response to a rising edge of second clock kl on a last burst of a burst sequence. For the read cycles, first and second enable signals (ren2 and dinen) can remain low so that data lines are not unnecessarily switched.

Second enable signal "dinen" can be generated by delaying first enable signal ren2. As shown in FIG. 1, this signal can be connected to write buffers (110-0 to 110-3). Thus, write buffers (110-0 to 110-3) can be allowed to operate in a write operation when write buffers are ready to write data into the core. For read cycles, first and second enable signals (ren2 and dinen) can remain low so that data lines are not unnecessarily switched.

FIG. 2 also includes two time periods that can reflect different possible timings for the same write operation. A time period "t SET_NRM" can represent a "normal" write access. A time period "t SET_RED" can represent a write operation to a redundant portion of a memory device.

FIG. 2 illustrates a four burst write operation to an address "A0". In such an operation, write data are provided in a burst beginning on the first clock cycle following the application of a write command. A write command may be entered in various ways, including but not limited to, a single write enable signal or a multi-bit operational command. Data for the burst write can be provided every ½ clock cycle.

Referring now to FIG. 2 in conjunction with FIG. 1, at time t0, a write operation can be initiated for address A0. As noted above, for the particular example illustrated, write data is not applied until a next clock cycle.

Prior to time t1, when clock qk is low and clock qkb is high, a first data value of a four value burst can be latched in master latch 102.

At about time t1, because clock qk is high, the data value stored in master latch 102 can be output to slave latches (106-0 to 106-3). It is understood that in other modes of operation, for such an initial part of a write operation, data values can be written into multiple stave latches, as write address decoding may not yet be complete or settled.

Such general steps can be repeated each ½ clock cycle, with second through fourth data values being stored in master latch 102, and subsequently output to different slave latches at times t2, t3 and t4, respectively. In this way, by time t5, a four data value burst of write data can be stored in slave latches (106-0 to 106-3).

At about time t5, first enable signal (ren2) may be activated, and the four data values stored in slave latches (106-0 to 106-3) can be output in parallel to write buffers (110-0 to 110-3), respectively.

At about time t6, a first enable signal (ren2) is inactive, second enable signal (dinen) can be activated. Write data from registers (108-0 to 108-3) can be input to write buffers 110-0 to 110-3. At this time, write registers (108-0 to 108-3) may be ready to write data to a core. However, as represented by times "t SET_NRM" and "t SET_RED", while timing may allow for a data write according to a normal data access, in other cases (e.g., redundant access) sufficient time for decoding/data muxing may not have passed. Accordingly, an actual write operation may be deferred to a later point.

At about time t7, write data corresponding to address A0 may be written into the appropriate locations of a device core. Such a write operation can be a "double" late write.

A noted previously, for some configurations, such as a burst length of two, the burst sequence may not be known or settled at the time of receiving a first data value. In such a case, received data may be stored in two (or more) of the slave latches until the burst sequence is substantially settled. Such an arrangement is illustrated in FIGS. 3 and 4.

Figure 3:
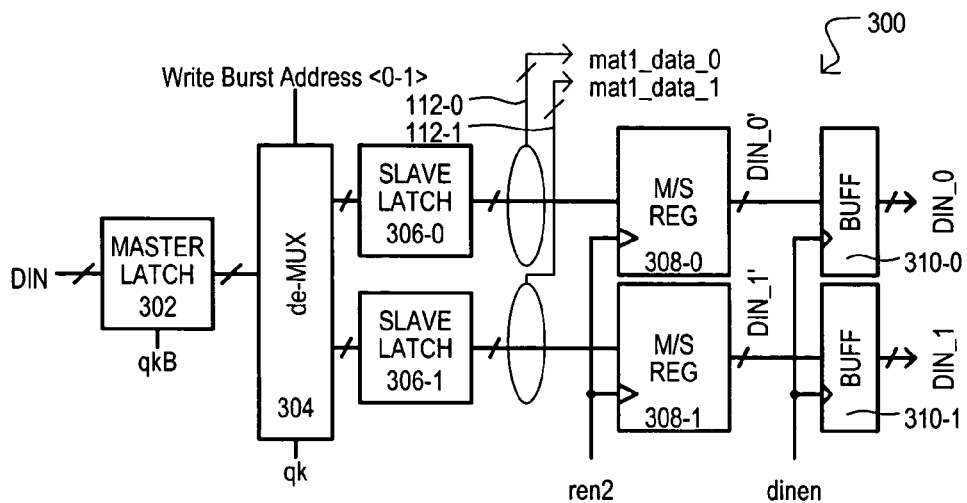
FIG. 3 is a schematic diagram of a data input path according to a second embodiment of the present invention.

FIG. 3 is a block schematic diagram of a data input path for accommodating a burst of two data values. FIG. 3 includes the same general components as FIG. 1. Thus, like components are referred to by the same reference character but with a first digit being a "3" instead of a "1", and a description of such components will be omitted.

Figure 4:
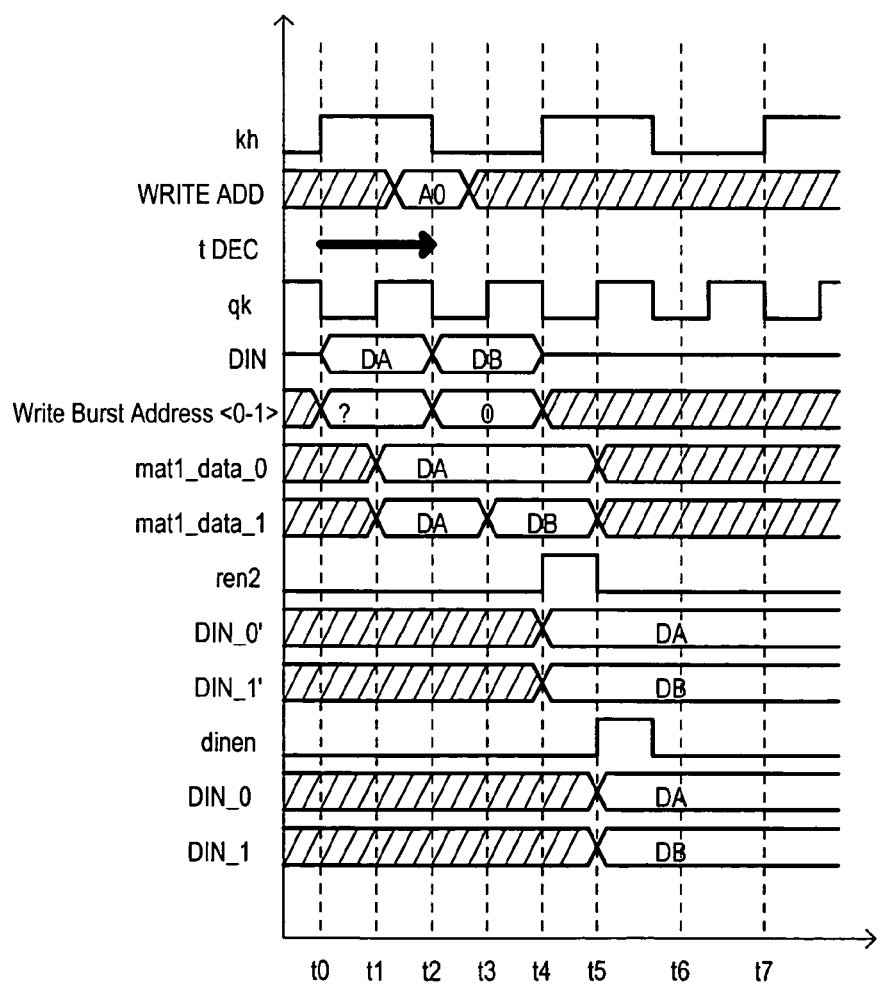
FIG. 4 is a timing diagram showing one mode of operation for the data input path of FIG. 3.

FIG. 4 is a timing diagram showing the operation of the input data path shown in FIG. 3. Unlike FIG. 2, FIG. 4 shows a two data value burst write operation in which write data can be input at the same time a write command is initiated.

Referring now to FIG. 3 in conjunction with FIG. 4, at about time t0, a data values for a two burst command can be provided. As represented by time period "t DEC", some time may be required before a write address A0 is received and/or fully decoded. Thus, an initial burst address may not be known at this time. To ensure proper capture of write data at this time, data DIN can be latched by master latch 302 as clock signal qk transitions low, and clock signal qkB (not shown) transitions high. In FIG. 3, such an input data value can be a data value DA.

At about time t1, a write address may still be unknown. However, to ensure a data value is loaded into a correct slave latch, a burst address value (Write Burst Address <0-1>) provided to de-MUX 304 can correspond to both an address "0" and "1". Consequently, when clock signal qk transitions high, data value DA can be transferred from master latch 302 to multiple slave latches 306-0 and 306-1. This is shown in FIG. 4 by the outputs of the slave latches (shown as "mat1_data_0" and "mat1_data_1") both being DA.

At about time t2, a second data value DB of the two value burst can be stored in master latch 302 when clock signal qk transitions low. In addition, as shown by time period "t DEC", sufficient time has passed to enable the burst address to be ascertained. In the particular example of FIG. 3, it is assumed that a base burst address is "0", thus the proper location of first data value DA should be slave latch 306-0. Accordingly, a second data value of a burst should be subsequently loaded into slave latch 306-1. In addition, a burst address at about time t2 will settle to the next address in the burst, which will be "1".

At about time t3, when clock signal qk transitions high, data value DB can be written into a slave latch according to the burst address value of "1". Thus, data value DB will be transferred from master latch 302 to slave latch 306-1 (overwriting the data value DA previously stored therein). This is shown in FIG. 3 by the outputs of slave latch 302-1 (shown as "mat1_data_1") changing to DB.

In this way, starting data values of a burst can be written into multiple slave latches while a burst address value may be uncertain, and subsequently overwritten with later data values of the burst.

The operation illustrated in FIG. 4 can continue in the same general fashion as FIG. 2, with data values DA and DB being propagated in parallel toward a core region by a first enable signal (ren2) and second enable signal (dinen).

Figure 5:
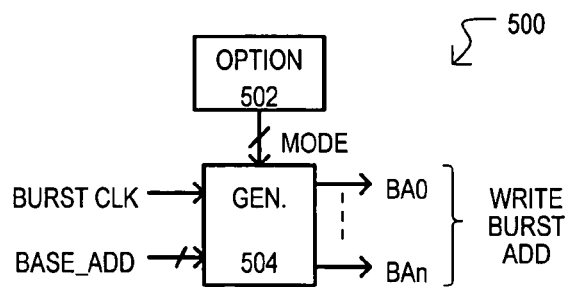
FIG. 5 is a block diagram illustrating one example of a burst address generator according to one embodiment.

Referring to FIG. 5, a block diagram shows a burst address generator circuit according to one embodiment of the present invention. A burst address generator circuit is designated by the general reference character 500 and can include an option portion 502 and a generator portion 504. An option portion 502 can provide option information (MODE) to a generator portion 504. In response to such mode information, a generator portion 504 can generate burst address values BA0 to BAn according to a burst clock BURST CLK and an address value BASE_ADD. In this way, the manner and/or sequence in which burst address values BA0 to BAn are generated can be selected according to an option portion 502.

In this way, a same data input path (e.g., data path 100 of FIG. 1) can accommodate various burst sequences with a relatively simple option.

Figure 6A:
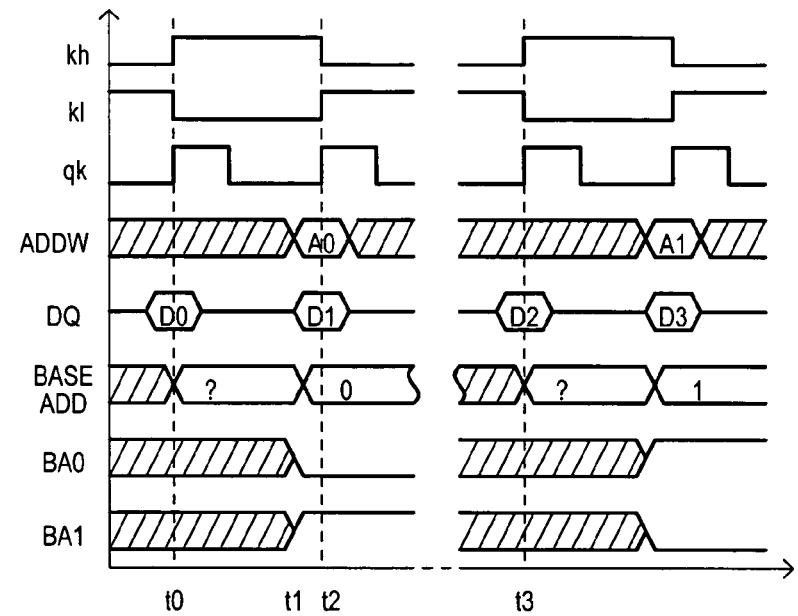
FIGS. 6A and 6B illustrate two of the many possible burst address generation options of the circuit set forth in FIG. 5.
Figure 6B:
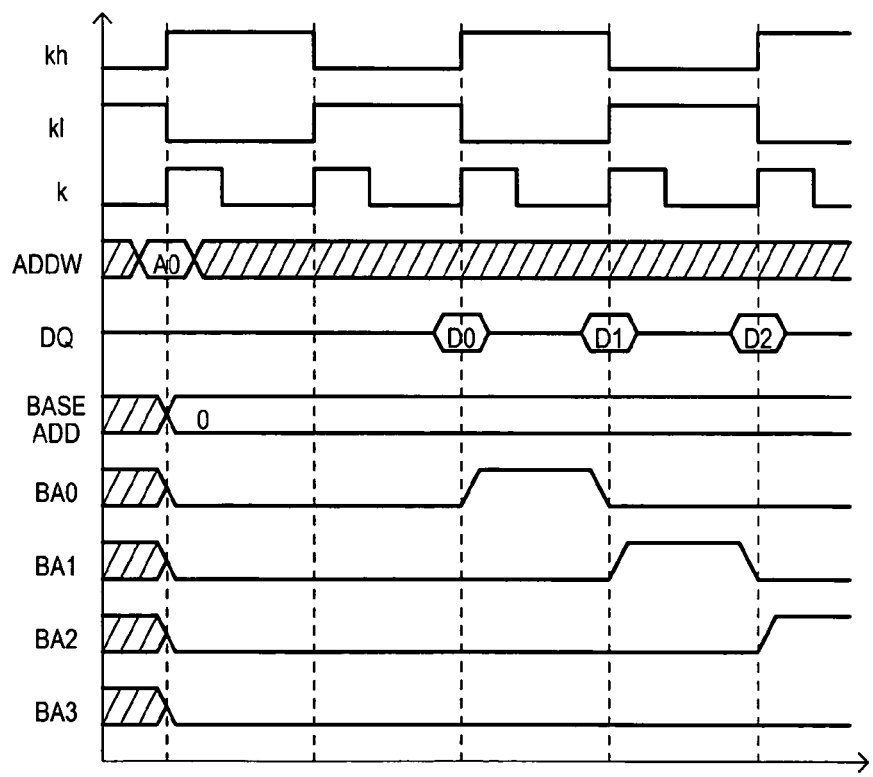

FIGS. 6A and 6B provide two of the many possible address generation options for a generator portion 504. FIG. 6A shows an example of the generation of an address for a two burst write operation in which a write address is applied at essentially the same time as write data. Such an operation can occur in two-burst QDR™ type memory devices, and was previously described in conjunction with FIGS. 3 and 4. Times t0 to t2 show a burst starting with a base burst address of "0". The operation following time t3 shows the operation with base burst address of "1".

FIG. 6B shows an example of the generation of an address for a four burst write operation in which write data is applied one clock cycle following a write address. Because such a configuration may allow for sufficient decoding of a write address, there may be no need to load write data into multiple slave latches. Thus, activation of address signals can be essentially mutually exclusive in time.

It is emphasized that while FIG. 6B shows the generation of a "linear" address burst, the invention is not limited to such an arrangement. As but two of the many possible examples, according to mode information MODE, a generator portion 504 could generate a user defined burst order, or some other standard burst order such as an "interleaved" burst address.

Figure 7:
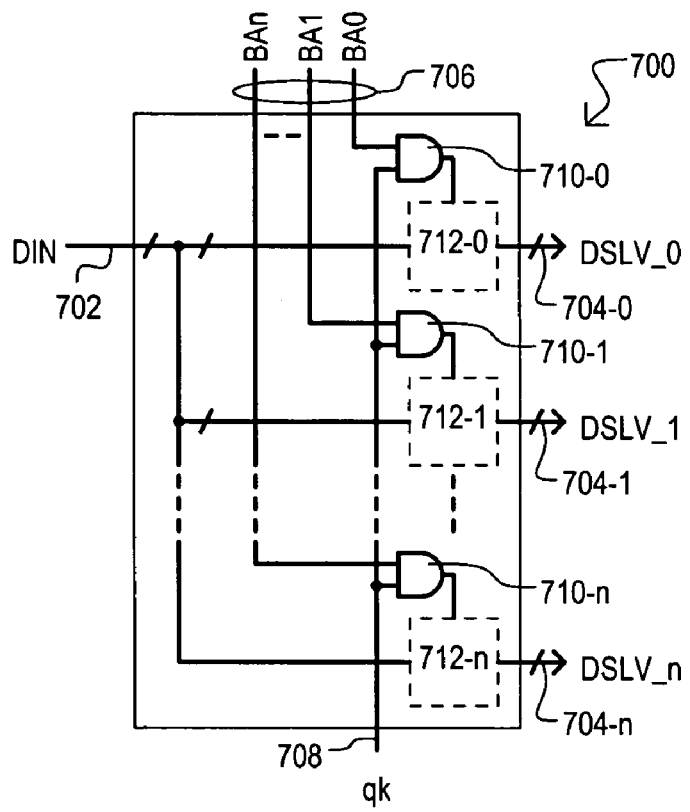
FIG. 7 is a block schematic diagram of one example of a de-multiplexer according to one embodiment.

Referring now to FIG. 7, a block schematic diagram is set forth illustrating one possible example of a de-MUX circuit, such as that shown as items 104 and 304 in FIGS. 1 and 3.

A de-MUX is designated by the general reference character 700 and may include a data input 702, multiple data outputs 704-0 to 704-n, burst address inputs 706, and a clock input 708. A data input 702 can receive bursts of input data, from a master latch for example. Data outputs (704-0 to 704-n) can output burst data to slave latches, for example. Burst address inputs 706 can receive burst address values BA0 to BAn from a burst address generator, for example. A clock input 708 can receive a clock signal qk for controlling when data are output in parallel on data outputs (704-0 to 704-n).

Within de-MUX 700 data may be provided on data outputs (704-0 to 704-n) according to the operation of logic gates 710-0 to 710-n and data paths 712-0 to 712-n. Data from data input 702 can be provided in parallel to data paths (712-0 to 712-n). Each data path (712-0 to 712-n) can be enabled according to a corresponding burst address value (BA0 to BAn) and clock qk by operation of logic gates (710-0 to 710-n).

It is understood that de-MUX 700 can be configured for any burst count value n. Further, in the case of a burst count of two, input burst addresses higher than BA1 (i.e., BA2 to BAn) may not be included or disabled according to mode information. Similarly, in the case of a burst count of two, higher data paths (i.e., 712-2 to 712-n) and logic gates (i.e., 710-2 to 710-n) can be disabled or not included.

Figures 8A, 8B, 8C:
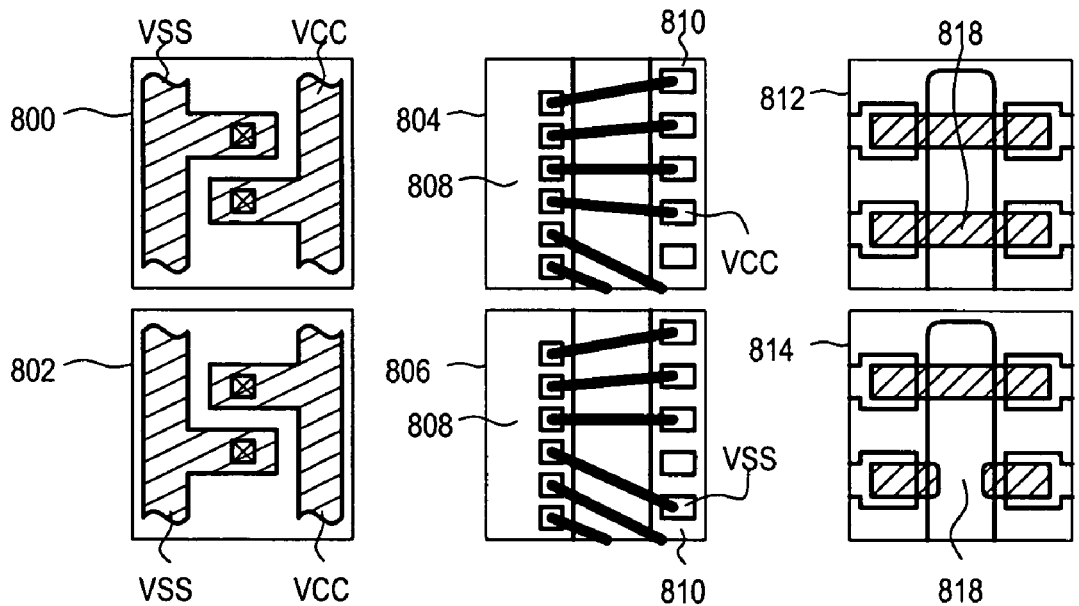
FIGS. 8A to 8C are top plan views of showing examples for generating mode options according to various embodiments.

Referring now to FIGS. 8A to 8C, a number of options approaches are set forth in a series of top plan views. Such approaches may be included in an option portion, such as that shown as 504 in FIG. 5. Such options may be relatively easy to implement in the manufacturing of a semiconductor device.

FIG. 8A shows a metal option variation. A comparison between views 800 and 802 shows how a change in a metallization layer pattern can result in a different connection arrangement, which can convey different mode values. Of course, FIG. 8A is but one very particular example, and should not be construed as limiting the invention thereto.

FIG. 8B shows a bonding option variation. A comparison between views 804 and 806 shows how a difference in bonding can result in different mode values. The views (804 and 806) show a portion of a die 808 including bond pads adjacent to a portion of a package 810 having conductive leads. Different options are achieved by differing bond wire connections. Of course, FIG. 8B is but one very particular example, and should not be construed as limiting the invention thereto. Bonding options are not limited to bond wire/bond pad arrangements and can include "bump" connections, as but one other example.

FIG. 8C shows a fuse-like option variation. A comparison between views 812 and 814 shows how a difference in fusible link status can result in a different mode values. Different options are achieved by opening one or more fusible link 818. Of course, FIG. 8C is but one very particular example, and should not be construed as limiting the invention thereto. Among that may other types of fuse-like options are nonvolatile programmable memory cells and "anti-fuse" type structures.

The present invention may also include methods of inputting data as set forth above in FIGS. 1-8C and the accompanying written description. As but one example, such a method may include enabling at least one of a number of data input options, and inputting data according to such an option. As another particular example, such a method can include outputting the same data to multiple parallel data paths as described in FIGS. 3-6B and the accompanying written description.

Figure 9:
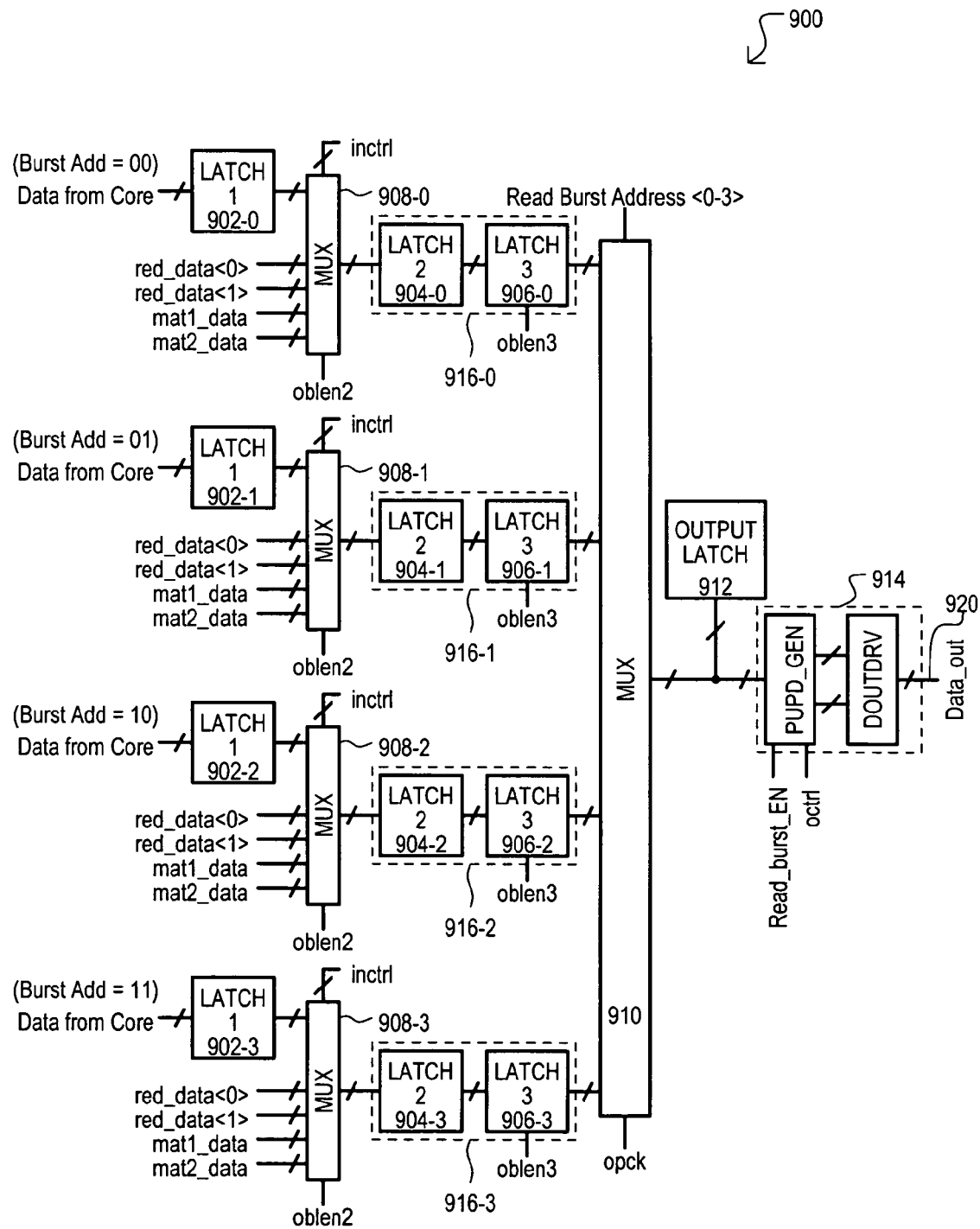
FIG. 9 is a schematic diagram of a data output path according to another embodiment of the present invention.

Referring now to FIG. 9, a data output path (DOUT PATH) according to another embodiment is shown in FIG. 9, and designated by the general reference character 900. A data path 900 can receive multiple data values in parallel, and output such values in a burst. The very particular data path 900 of FIG. 9 can receive up to four data values in parallel, and output such values in bursts of two or four. Further, such bursts of output data can be ordered according to mode information, and thus may take a predefined fixed or user-defined burst order.

Data path 900 can include first latches 902-0 to 902-3, second latches 904-0 to 904-3, and third latches 906-0 to 906-3. A data path 900 can further include input multiplexers (MUXs) 908-0 to 908-3, an output MUX 910, an output latch 912, and an output driver 914.

First latches (902-0 to 902-3) can be arranged in parallel, and can receive data for a burst from a core portion of a device. In particular, first latches 902-0 to 902-3 can receive data corresponding to burst addresses 00 to 11, respectively. Each first latch (902-0 to 902-3) can output data to a corresponding input MUX 908-0 to 908-3, respectively. First latches (902-0 to 902-3) can be used to hold data after a corresponding data driver from the core (not shown) is placed in a high impedance (i.e., tri-state) condition. This can allow output data to be captured, while other operations can take place in the core.

Input MUXs (908-0 to 908-3) can be arranged in parallel, and in addition to data for first latches (902-0 to 902-3), can receive data from other sources. In the particular example of FIG. 9, each input MUX (908-0 to 908-3) can receive data from a first redundant portion of a device (red_data<0>) or a second redundant portion of a device (red_data<0>), as well as match data from a data input path (mat1_data and mat2_data). As described above, match data (mat1_data/mat2_data) can be write data propagating through a data input path corresponding to the same address as data to be accessed via data path 900. Input MUXs (908-0 to 908-3) can output data in parallel according to a first enable signal (oblen2).

Second latches 904-0 to 904-3 can be arranged in parallel with, and receive data from, input MUXs 908-0 to 908-3, respectively. Second latches (904-0 to 904-3) can be used to protect data from a read operation until a burst operation is complete. That is, second latches (904-0 to 904-3) can hold a data set for a burst sequence while a previous burst sequence is being sequentially output from data path 900.

Third latches 906-0 to 906-3 can be arranged in parallel with, and receive data from, first latches 904-0 to 904-3, respectively. Third latches (906-0 to 906-3) can output data in parallel according to a second enable signal (oblen3). As will be described in more detail at a later point herein, third latches (906-0 to 906-3) can be used to present data to an output latch 912 at the appropriate time when an input clock (k) and the output clock (opck) have a predetermined phase relationship. In this way, an output latch 912 can be used to send out data at desired clock edges.

It is noted that the series connection of second latches to third latches can form latch sets 916-0 to 916-3.

Output MUX 910 can receive data in parallel from third latches (906-0 to 906-3), but output such data in a burst sequence according to burst address values (Read. Burst Address <0-3>) and an output clock "opck".

Bursts of data output from output MUX 910 can be stored in output latch 912. Such data may then be driven on output lines 920 by output driver 914.

Control signals for a data path 900 (e.g., oblen2, oblen3 and opck) may be generated by a data out control section. The relative timings of these signals can enable the data path 900 to accommodate multiple modes of operation, as will be discussed in more detail below. In particular, a data path 900 can be configurable to support the following options: single or double clocking modes, phase shifting between input and output clocks of between 0 and 180°, delay-locked loop (DLL) enabled and disabled cases, and regular, redundant, and match cases.

A single clocking arrangement can include data input and output timing being controlled according to a single clock signal (e.g., k). In a DLL enabled case, an output clock can be generated by applying an input clock to a DLL-type circuit. A double clocking mode can include data input and output timing being controlled according to a data input clock (e.g., k) and a data output clock (e.g., c). Unlike conventional arrangements, a data output path may accommodate phase shifts between such different clocks of up to 180°.

Having described the general construction of a data path 900 according to one embodiment, the operation of such an arrangement will now be described with reference to FIG. 9 in conjunction with FIGS. 10A to 10C.

Figure 10A:
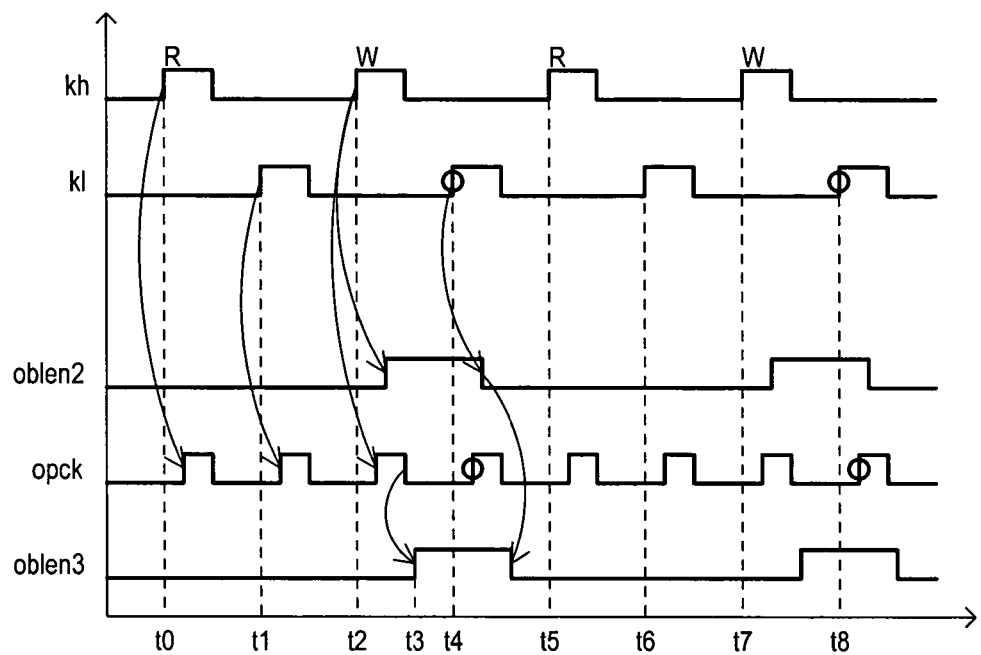
FIGS. 10A to 10C are timing diagrams showing various modes of operation for the data path of FIG. 9.

FIG. 10A is a timing diagram showing a first mode of operation for the data path 900 of FIG. 9. FIG. 10A shows a waveform for a first input clock kh, a second input clock kl, a first enable signal "oblen2", output control clock "opck", and second enable signal "oblen3". A first input clock kh may be generated in response to rising edges of an external input clock (e.g., kh(ext)), while a second input clock kl may be phase shifted with respect to first input clock kh by about 180°. For example, a second input clock kl may be generated in response to a second external clock (e.g., kl(ext)). Output control clock opck can be generated in response to rising edges of both first and second clock signals.

FIG. 10A also indicates the initiation of a particular data access operation by the letters "R" and "W" shown with waveform kh. Letter "R" can represent the initiation of a read operation and letter "W" can represent the initiation of a write operation. Arrows indicate how one clock/signal may be generated in response to another clock/signal.

In the very particular example of FIG. 10A, a first enable signal "oblen2" can be activated by a next rising edge of first clock kh following the initiation of a read operation. First enable signal oblen2 cab be deactivated by a following rising edge of second clock kl. As a result, first path enable clock oblen2 can have a duration of about ½ an external clock cycle k.

FIG. 10A will be used to show a four burst read operation in which data path 900 is operated in a single clocking mode and a DLL is disabled.

At about time t0, on a rising edge of first input clock kh, a read operation can be initiated by application of an address and a read operation indication. A read operation can include, but is not limited to, activation of a read pulse, non-activation of write pulse, or reception of read command.

Between times t0 and t2, output data can be presented in parallel to input MUXs (908-0 to 908-3). For example, in a "regular" read operation, a read address applied at time t0 can be decoded and corresponding core data can be input to first latches (902-0 to 902-3). First latches (902-0 to 902-3) can provide such core data at inputs to input MUXs (908-0 to 908-3). In a redundant access, a read address can be identified as a defective address, and redundant read data for such an address can be accessed in lieu of "regular" data. Such data can be presented at one of redundant data inputs (red_data<0 or red_data<1>) to input MUXs (908-0 to 908-3). In a match case, a read address can be identified as corresponding to a write address. Match data from a data input path can be presented at corresponding match inputs (mat1_data or mat2_data) to input MUXs (908-0 to 908-3). It is understood that such data represents all data values of a four burst sequence.

Shortly after time t2, a little more than one clock cycle following read operation initiation, a first enable clock "oblen2" can be activated in response to a rising edge of first clock kh. This can result in read data being presented in parallel to second latches (904-0 to 904-3). Such an operation may be in conjunction with input control values (inctrl) generated according to the type of access (e.g., regular, redundant, or match). Data stored in second latches (904-0 to 904-3) can propagate as input data to third latches (904-0 to 904-3).

At about time t3, after first enable clock oblen2 is activated, output control clock opck can fall. This can represent completion of a previous burst sequence. In response to such a transition, second enable signal oblen3 can be activated. In this way, data for a burst sequence can be output in parallel to output MUX 910, which has since concluded outputting any previous burst sequence.

At about time t4, in response to a rising edge of second clock kl, first enable signal can return to an inactivate state. Thus, input MUXs (908-0 to 908-3) can receive new data without corrupting the present burst sequence. In addition, output control clock opck can pulse high. In response to such a pulse, and according to burst address values (Read Burst Address <0-3>), output MUX 910 can output a first data value according to a particular burst sequence. Such a first data value can be latched in output latch 912 and then driven on output lines 920 by output driver 914.

Shortly after time t4, in response to the previous rising edge of second clock kl, second enable signal (oblen3) can return to an inactivate state. In this way, new output data can be free to propagate through latch sets (916-0 to 916-3).

The next three data values of a four-burst sequence can be output from output MUX 910 at about times t5, t6 and t7.

Figure 10B:
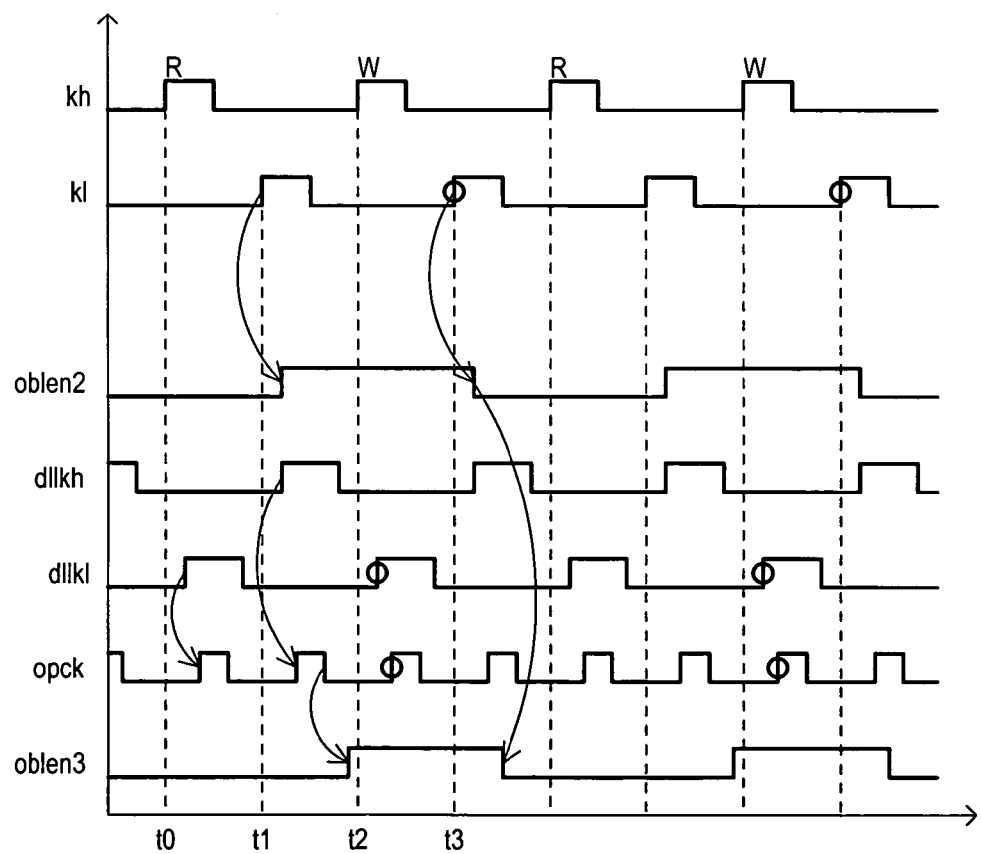

Referring now to FIG. 10B in conjunction with FIG. 9, a single clocked, four burst read operation will be described in which a DLL is enabled.

FIG. 10B, like FIG. 10A, shows waveforms for a first input clock kh, a second input clock kl, a first enable clock "oblen2", output clock "opck", and second enable clock "oblen3". A first input clock kh may be generated in response to rising edges of an external input clock (e.g., k), while a second input clock kl may be phase shifted with respect to first input clock kh by about 180°. Further, FIG. 10B also indicates the initiation of a particular data access operation by the letters "R" and "W", and arrows indicate how one clock may be generated in response to another clock.

In the DLL enabled operation of FIG. 10B, unlike the DLL disabled operation of FIG. 10A, a first enable signal "oblen2" can be activated by a next rising edge of a second clock kl following the initiation of a read operation. However, like the DLL disabled arrangement, the first path enable clock oblen2 can be deactivated by a following rising edge of the second clock kl. As a result, in this mode, a first enable clock oblen2 can be activated for a duration of about one full external clock cycle k.

The operation of FIG. 10B also differs from FIG. 10A in that phase shifted clock signals "dllkh" and "dllkl" can be generated. Such clock signals (dllkh and dllkl) can be generated by phase shifting first and second clock signals kh and kl with a phase shift circuit including, but not limited to, a delay locked loop circuit (DLL) or phase locked loop circuit (PLL), as but two examples. An output control clock opck can then be generated in response to rising edges of phase shifted clocks dllkh and dllkl.

Referring now to FIG. 10B, at about time t0, on a rising edge of first input clock kh, a read operation can be initiated by application of an address and a read operation indication. Between times t0 and t1, output data can be presented in parallel to input MUXs (908-0 to 908-3) in the same general fashion as described with respect to FIG. 10A, and output data can be presented at data inputs of input MUXs (908-0 to 908-3).

Shortly after time t1, a little more than half a clock cycle following read operation initiation, a first enable clock "oblen2" can be activated in response to a rising edge of second input clock kl. This can result in read data being presented in parallel to second latches (904-0 to 904-3) in the same general fashion as in FIG. 10A (but earlier in time). Data stored in second latches (904-0 to 904-3) can propagate as input data to third latches (904-0 to 904-3).

Also after time t1, output control clock opck can rise in response to a rising edge of phase shifted clock dllkh, and subsequently fall. This can represent completion of a previous burst sequence timing.

As in the case of the DLL enabled case, in response to the falling transition of output control clock opck, second enable signal oblen3 can be activated. In this way, data for a burst sequence can be output in parallel to output MUX 910, which has since concluded any previous burst sequence. Further, at about time t3, in response to a rising edge of second clock kl, first enable signal oblen2 can return to an inactivate state.

The operation of data path 900 can proceed in the same general fashion as the DLL disabled case, with data values being output from output MUX 910 according to burst address values on pulses of output control clock opck following time t3.

In this way, a data path 900 can accommodate a both a DLL disabled case and DLL enabled case single clocking operation.

Figure 10C:
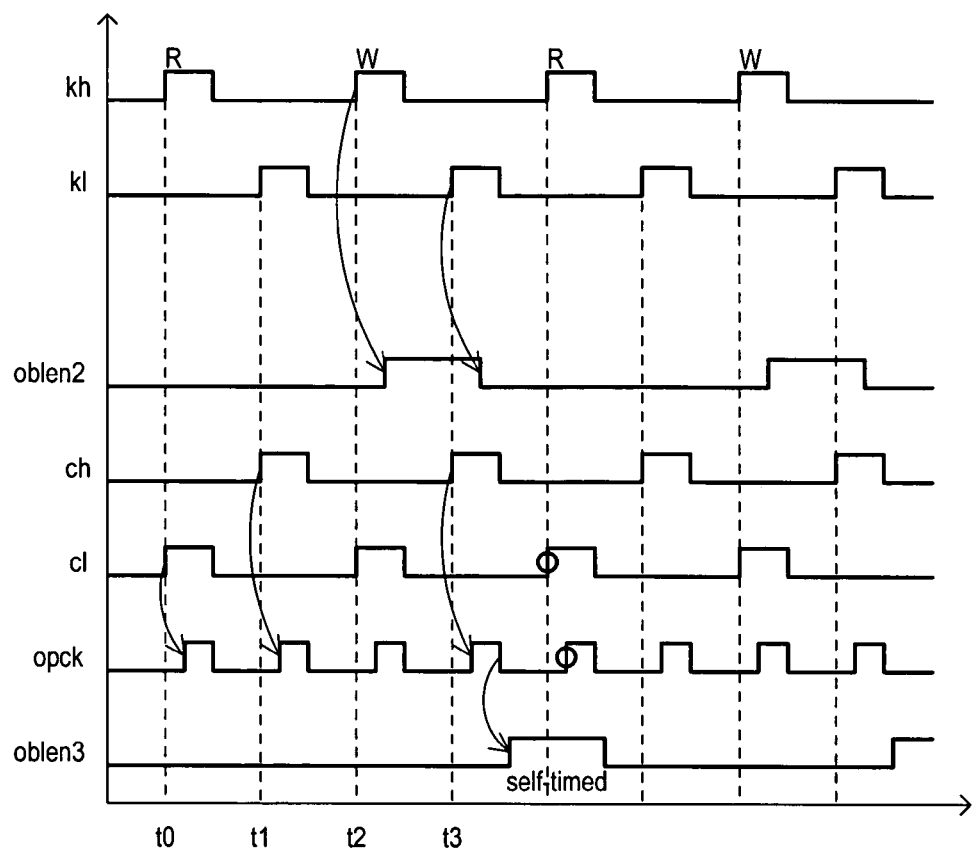

Referring now to FIG. 10C in conjunction with FIG. 9, a double clocked, four burst read operation will be described. Further, an output clock (c) may be phase shifted with respect to an input clock (k) by about 180°.

FIG. 10C, like FIGS. 10A and 10B, shows waveforms for a first input clock kh, a second input clock kl, a first enable clock "oblen2", output clock "opck", and second enable clock "oblen3". The figure also indicates the initiation of a particular data access operation by the letters "R" and "W".

In a double clocking mode, a first enable signal oblen2 can be generated in the same fashion as a DLL disabled mode. Thus, in this double clocking mode, a first path clock oblen2 can have a duration of about ½ an external clock cycle k.

The operation of FIG. 10C differs from FIGS. 10A and 10B in that output control clock opck can be generated in response to a second output clock (c) that is different than an input clock (k). More particularly, a first output clock ch may be generated in response to rising edges of an external output clock (c), while a second output clock cl may be phase shifted with respect to first output clock ch by about 180°. Output control clock opck can be generated in response to rising edges of both first and second output clock signals (ch and cl).

Referring now to FIG. 10C, at about time t0, on a rising edge of first input clock kh, a read operation can be initiated. Between times t0 and t2, output data can be presented in parallel to input MUXs (908-0 to 908-3) in the same general fashion as described in FIG. 10A.

Like the single clocked DLL disabled case, shortly after time t2, a little more than one clock cycle following read operation initiation, a first enable clock "oblen2" can be activated in response to a rising edge of first clock kh. Data can thus be stored in second latches (904-0 to 904-3) and propagate as input data to third latches (904-0 to 904-3).

At about time t3, after first enable clock oblen2 is activated, output control clock opck can fall. This can represent completion of a previous burst sequence timing. In response to such a transition in the output control clock opck, second enable signal oblen3 can be activated. In this way, data for a burst sequence can be output in parallel to output MUX 910, which has since concluded any previous burst sequence.

Unlike the single clocking case of FIGS. 10A and 10B, in the double clocking case a second enable signal oblen2 can be self-timed. That is, the signal may be terminated after a predetermined delay. Thus, second enable signal oblen3 is shown in FIG. 10C with the label "self-timed".

The four data values of a four-burst sequence can be output from output MUX 910 on sequential pulses of output control clock opck following the activation of second enable signal oblen3. Such output values can be latched and driven as described above with output latch 912 and output driver 914.

It is understood that burst address values for an output MUX can be selectable according to an options, in the same general fashion as described in conjunction with FIGS. 7 to 8C. In this way different types of output burst sequences can also be accommodated.

The embodiment of FIG. 9 as described herein can advantageously accommodate several device options, clocking modes, and cases of operation in a relatively simple and flexible design. The device reconfiguration can be accomplished through bond and/or metal options, as described above for example, and the overhead (e.g., die spaces) in terms of both operating speed and circuit area is minimal compared to conventional solutions.

In addition, the utilization of a series of three latches (e.g., first latches, second latches and third latches) is believed to accommodate such various modes/options with a minimal number of circuits. Thus, the data path of FIG. 9 provides added flexibility without undue increases in overhead.

Figure 11:
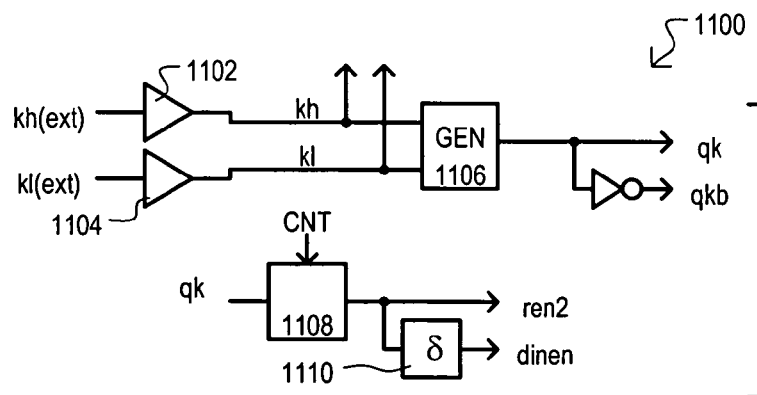
FIG. 11 is a block schematic diagram representing a clock generating path for a data input path like that shown in FIG. 1.

Referring now to FIG. 11, an input clock generation path is represented by a block a schematic diagram. Input clock generation path 1100 shows one very particular way in which control signals for a data input path, like that of FIG. 1, can be generated.

External input clock kh(ext) can be applied to a buffer 1102 to generate a first clock kh. In a similar fashion, an external clock kl(ext), which may be a different than clock kh(ext) can be applied to a buffer 1104 to generate second clock kl. First and second clocks (kh and kl) can be applied to a clock generator circuit 1106 that generates a pulse in response to a high-going transition in both clock signals (kh and kl) to arrive at clock qk. Clock qk can be inverted to generate inverted clock qkb.

Referring still to FIG. 11, clock qk can be applied to a selective activation circuit 1108. Selective activation circuit 1108 can receive a count indication CNT. In particular, a count indication can be activated following a last count of a burst sequence period. Thus, a first enable signal ren2 can be generated once a last burst count is reached (e.g., on the transition of last qk pulse of a burst time period). In the very particular example of FIG. 11, a second enable signal dinen can be generated by delaying a first enable signal ren2 with delay circuit 1110.

Figure 12A:
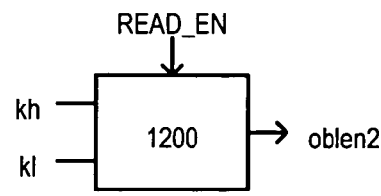
FIGS. 12A and 12B are block schematic diagrams showing options for generating a first enable signal for a data output path like that shown in FIG. 9.
Figure 12B:
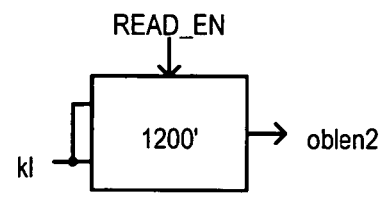

Referring now to FIGS. 12A and 12B, two options for generating a first enable signal oblen2 for a data output path, such as that shown in FIG. 9, are shown in block diagrams. In FIG. 12A, pulse generating circuit 1200 can generate a first enable signal oblen2 when a read enable signal READ_EN is active. In particular, when a read enable signal READ_EN is active, a pulse generating circuit 1200 can drive a first enable signal oblen2 high in response to a first clock kh, and low in response to a subsequent rise in second clock kl. As but two examples, such an option can be employed for a single clocking DLL disabled mode and a double clocking mode.

In the second option of FIG. 12B, pulse generating circuit 1200' can generate a first enable signal oblen2 when a read enable signal READ_EN is active. However, when a read enable signal READ_EN is high, a pulse generating circuit 1200' can drive a first enable signal oblen2 high in response to a first transition in second clock kl, and low in response to a subsequent rise in second clock kl. As but one example, such an option can be employed for a single clocking DLL enabled mode.

Figure 13A:
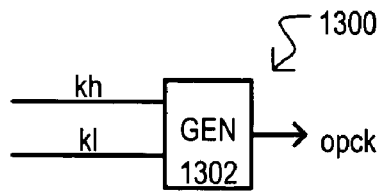
FIGS. 13A to 13C are block schematic diagrams showing options for generating an output control clock for a data output path like that shown in FIG. 9.
Figure 13B:
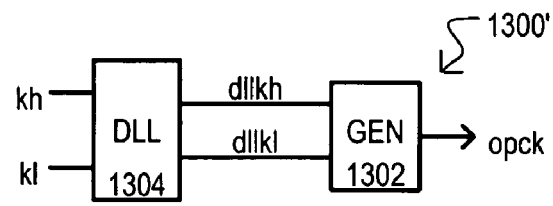
Figure 13C:
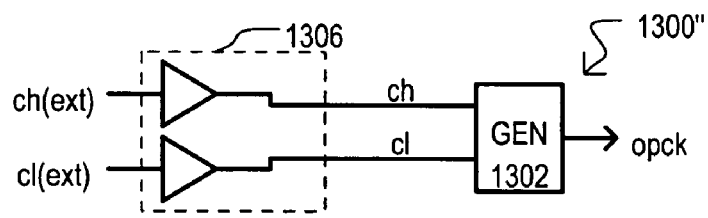

Referring now to FIGS. 13A to 13C, three options for generating an output control clock opck, for a data output path such as that shown in FIG. 9, are shown in block diagrams.

In option 1300 of FIG. 13A, first and second clocks (kh and kl) can be applied to a clock generator circuit 1302 that generates a pulse in response to a high-going transition in both clock signals (kh and kl) to arrive at output control clock opck. Such an option may be utilized for a single clocked DLL disabled mode, as but one example.

In option 1300' of FIG. 13B, first and second clocks (kh and kl) can be applied to a phase shifting circuit 1304, in this example a DLL 1304. Phase shifting circuit 1304 can generate phase shifted clock signals dllkh and dllkl. A clock generator circuit 1302 can then generate a pulse in response to a high-going transition in either phase shifted clock signal to arrive at output control clock opck. Such an option may be utilized for a single clocked DLL enabled mode, as but one example.

In option 1300" of FIG. 13C, external output clocks ch(ext) and cl(ext) can be applied to buffers 1306 to generate a first output clock ch and a second output clock cl. A clock generator circuit 1302 can then generate a pulse in response to a high-going transition in either output clock to arrive at output control clock opck. Such an option may be utilized for a double clocked mode, as but one example.

Figure 14A:
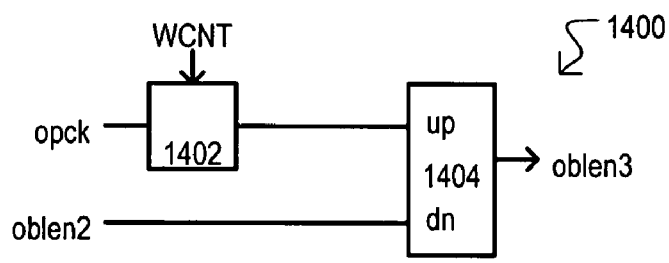
FIGS. 14A and 14B are block schematic diagrams showing options for generating a second enable signal for a data output path like that shown in FIG. 9.
Figure 14B:
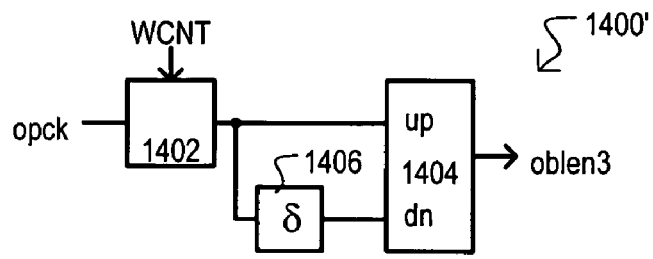

Referring now to FIGS. 14A and 14B, two options for generating a second enable signal oblen3, for a data output path such as that shown in FIG. 9, are shown in block diagrams.

In option 1400 of FIG. 14A, an output control clock opck can be applied to a selective activation circuit 1402. Selective activation circuit 1402 can receive a count indication WCNT and activate a third enable signal oblen3 in response thereto. In particular, a count indication can be activated on a last count of a burst sequence time period. Thus, a second enable signal oblen3 can be activated once a last burst count is reached (e.g., on the transition of last opck pulse of a burst time period). This is represented in FIG. 14A by the output of selective activation circuit 1402 being applied to an "up" input of pulse generator 1404. A same second enable signal oblen3 pulse can be deactivated in response to a first enable signal oblen2. In particular, second enable signal oblen3 can be deactivated in response to first enable signal oblen2 being deactivated. This is represented in FIG. 14A by first enable signal oblen2 being applied to a "dn" input of pulse generator 1404. Such an option may be used in a single clocking DLL enabled or DLL disable mode, as but two examples.

In option 1400' of FIG. 14B, a second enable signal oblen3 can be activated in the same fashion as described for FIG. 14A above. However, such an activation can be self-timed (e.g., a one-shot type response). Thus, in the particular example of FIG. 14B, an activated second enable signal oblen3 can be deactivated by delaying the output of selective activation circuit 1402. This is represented in FIG. 14B by the output of selective activation circuit 1402 being applied to a "dn" input of pulse generator 1404 by way of a delay circuit 1406. Thus, a resulting second enable signal oblen3 can have a duration equal to a delay of a delay circuit 1406. Such an option may be used in a double clocking mode, as but one example.

Of course, the numerous clocks described above may be generated by various alternate approaches, and include additional components, such as buffers, conditioners, intervening logic circuits conditioned on other signals, or interlock circuits as needed in a particular application, to name but a few examples. The above examples represent generalized approaches to illustrate clock generation.

The present invention may also include methods of outputting data as set forth above in FIGS. 9-14B and the accompanying written description. As but one example, such a method may include enabling at least one of a number of data output options, and outputting data according to such an option.

It is understood that the embodiments of the invention may be practiced in the absence of an element and or step not specifically disclosed. That is, an inventive feature of the invention can be elimination of an element or step.

Accordingly, while the various aspects of the particular embodiments set forth herein have been described in detail, the present invention could be subject to various changes, substitutions, and alterations without departing from the spirit and scope of the invention.

What is claimed is:

1. A configurable data path, comprising:
   a de-multiplexer (de-MUX) that provides data paths between an input that receives multi-bit data values in a sequential manner and a plurality of outputs according to a sequence controlled by a plurality of burst write address values;
   a plurality of first latches coupled in parallel to the de-MUX, each first latch having an input that receive a multi-bit data value from a corresponding de-MUX output;
   a plurality of data registers coupled in parallel to the plurality of first latches, each data register having an input that receives a multi-bit data value from a corresponding first latch output; and
   a burst address generator that generates the burst write address values according to one of a plurality of sequences selectable as a device option.

2. The configurable data path of claim 1, wherein:
   the de-MUX is configurable for at least two modes of operation,
      in a first mode of operation the de-MUX provides data paths between the de-MUX input and de-MUX outputs in a sequential manner, and
      in a second mode of operation the de-MUX provides data paths to at least two of the de-MUX outputs in parallel.

3. The configurable data path of claim 1, wherein:
   the plurality of data registers are controlled by a register enable signal activated during at least a write operation.

4. The configurable data path of claim 3, further including:
   a plurality of write buffers coupled in parallel to the data registers, each write buffer having an input that receives a multi-bit value from a corresponding data register.

5. The configurable data path of claim 4, wherein:
   the plurality of write buffers are controlled by a data input enable signal that is activated after the register enable signal in the at least write operation.

6. The configurable data path of claim 1, further including:
   a first match data path, coupled between the outputs of the first latches and a read data path, that provides write data that is in transit through the configurable data path to the read data path.

7. The configurable data path of claim 6, further including:
   a second match data path, coupled between the outputs of the data registers and a read data path, that provides write data that is in transit through the configurable data path to the read data path.

* * * * *